(12) United States Patent
Lee et al.

(10) Patent No.: US 11,591,691 B2
(45) Date of Patent: Feb. 28, 2023

(54) METHOD OF FORMING A THIN FILM USING A SURFACE PROTECTION MATERIAL

(71) Applicants: EGTM CO., LTD., Suwon-si (KR); SK hynix Inc., Icheon-si (KR)

(72) Inventors: Geun Su Lee, Suwon-si (KR); Jae Min Kim, Bucheon-si (KR); Ha Na Kim, Suwon-si (KR); Woong Jin Choi, Suwon-si (KR); Eun Ae Jung, Hwaseong-si (KR); Dong Hyun Lee, Yongin-si (KR); Myung Soo Lee, Seoul (KR); Ji Won Moon, Yongin-si (KR); Dong Hak Jang, Suwon-si (KR); Hyun Sik Noh, Suwon-si (KR)

(73) Assignees: EGTM CO., LTD., Suwon-si (KR); SK HYNIX INC., Icheon-si (KR)

(*) Notice: Subject to any disclaimer, the term of this patent is extended or adjusted under 35 U.S.C. 154(b) by 301 days.

(21) Appl. No.: 16/937,758

(22) Filed: Jul. 24, 2020

(65) Prior Publication Data

US 2021/0130954 A1    May 6, 2021

(30) Foreign Application Priority Data

Nov. 5, 2019   (KR) .................. 10-2019-0140104

(51) Int. Cl.
*C23C 16/455* (2006.01)
*C23C 16/02* (2006.01)
*C23C 16/06* (2006.01)

(52) U.S. Cl.
CPC .... *C23C 16/45534* (2013.01); *C23C 16/0272* (2013.01); *C23C 16/06* (2013.01); *C23C 16/45553* (2013.01); *C23C 16/45561* (2013.01)

(58) Field of Classification Search
CPC .......... C23C 16/45534; C23C 16/0272; C23C 16/06; C23C 16/45553; C23C 16/45561;
(Continued)

(56) References Cited

U.S. PATENT DOCUMENTS 10,468,264 B2    11/2019  Lim et al.
2012/0276306 A1*  11/2012  Ueda .................. C23C 16/40
                                                    427/576

FOREIGN PATENT DOCUMENTS

CN    103103494 B    12/2014
JP    2018006753 A    1/2018
WO    2017188546 A1   11/2017

OTHER PUBLICATIONS

STIC Search Report (dated 2021).*

* cited by examiner

*Primary Examiner* — Michael B Cleveland
*Assistant Examiner* — Michael G Miller
(74) *Attorney, Agent, or Firm* — Rabin & Berdo, P.C.

(57) ABSTRACT

Disclosed is a method of forming a thin film using a surface protection material, the method comprising supplying the surface protection material to the inside of a chamber on which a substrate is placed so that the surface protection material is adsorbed to the substrate, discharging the unadsorbed surface protection material from the inside of the chamber by purging the interior of the chamber, supplying a metal precursor to the inside of the chamber so that the metal precursor is adsorbed to the substrate, discharging the unadsorbed metal precursor from the inside of the chamber by purging the interior of the chamber, and supplying a reaction material to the inside of the chamber so that the reaction material reacts with the adsorbed metal precursor to form the thin film.

8 Claims, 6 Drawing Sheets

(58) Field of Classification Search
CPC ............ C23C 16/4404; C23C 16/4408; C23C 16/405; C23C 16/045; H01L 21/0228
See application file for complete search history.

|  | GPC Increase Rate |
|---|---|
| Comparative Example | 2.6 |
| Example 1 | 1.2 |
| Example 2 | 0.48 |

METHOD OF FORMING A THIN FILM USING A SURFACE PROTECTION MATERIAL

TECHNICAL FIELD

The present invention relates to methods of forming a thin film. More particularly, the present invention relates to methods of forming a thin film using a surface protection material.

BACKGROUND

In the semiconductor process field, the deposition process is an important process for depositing a material on a substrate, and the aspect ratio of the feature increases more and more as the appearance of electronic devices continues to decrease and the density of the device increases. Accordingly, a process having good step coverage is attracting attention, and atomic layer deposition (ALD) is receiving considerable attention.

During the atomic layer deposition (ALD) process, reaction gases are sequentially supplied to a process chamber on which a substrate is placed. A first reaction gas is supplied to the process chamber and adsorbed to the surface of the substrate. The second reaction gas is supplied to the process chamber to react with the adsorbed first reaction gas, so that a thin film is formed.

An object of the present invention is to provide methods of forming a thin film having good step coverage.

Another object of the present invention is to provide methods of forming a thin film, which are capable of significantly improving the temperature range in which the ALD process is possible.

Other objects of the present invention will become more apparent from the following detailed description.

SUMMARY

Disclosed is a method of forming a thin film using a surface protection material, the method comprising supplying the surface protection material to the inside of a chamber on which a substrate is placed so that the surface protection material is adsorbed to the substrate, discharging the unadsorbed surface protection material from the inside of the chamber by purging the interior of the chamber, supplying a metal precursor to the inside of the chamber so that the metal precursor is adsorbed to the substrate, discharging the unadsorbed metal precursor from the inside of the chamber by purging the interior of the chamber, and supplying a reaction material to the inside of the chamber so that the reaction material reacts with the adsorbed metal precursor to form the thin film.

The surface protection material may be represented by the following Chemical Formula 1:

<Chemical Formula 1> wherein n is 1 or 2, and X is selected from the $CH_2$, O, S, NH, and R is selected from an alkyl group having 1 to 5 carbon atoms.

The surface protection material may be represented by the following Chemical Formula 2:

<Chemical Formula 2> wherein n is 1 or 2, and X is selected from the $CH_2$, O, S, NH, and R is selected from an alkyl group having 1 to 5 carbon atoms.

The surface protection material may be represented by the following Chemical Formula 3:

<Chemical Formula 3>

The surface protection material may represented by the following Chemical Formula 4:

<Chemical Formula 4>

The reaction material may be selected from water vapor ($H_2O$), oxygen ($O_2$) and ozone ($O_3$).

The metal precursor may be a compound including at least one of a trivalent metal containing Al, a tetravalent metal containing Zr or Hf, and a pentavalent metal containing Nb or Ta.

DETAILED DESCRIPTION

Hereinafter, embodiments of the present invention will be described using FIGS. 1 to 8. The embodiments of the present invention may include various modifications, and the scope of the present invention should not be construed to be limited to the embodiments described below.

In the conventional deposition process using a single precursor in a trench structure having a high aspect ratio (for example, 40:1 or more), a thin film deposited on an upper part(or an entrance) of the trench becomes thicker, and a thin film deposited on a lower part(or a bottom) of the trench becomes thinner. Therefore, the step coverage of the thin film is poor and not uniform.

However, the surface protection material described below behaves in the same manner as the metal precursor, and the surface protection material is adsorbed at a higher density in the upper part of the trench than in the lower part of the trench to impede the adsorption of the metal precursor in a subsequent process, therefore the metal precursor reacts with a reaction material to form the thin film having an uniform thickness in the trench.

Figure 1:
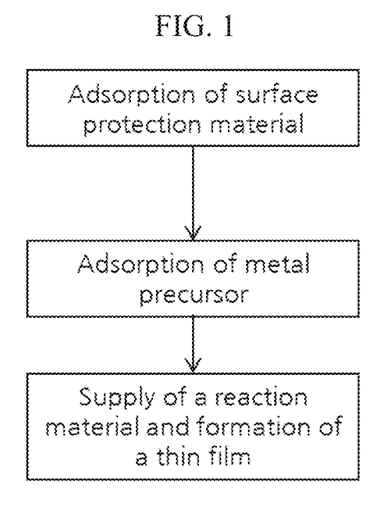
FIG. 1 is a flowchart schematically demonstrating a method of forming a thin film according to an embodiment of the present invention.
Figure 2:
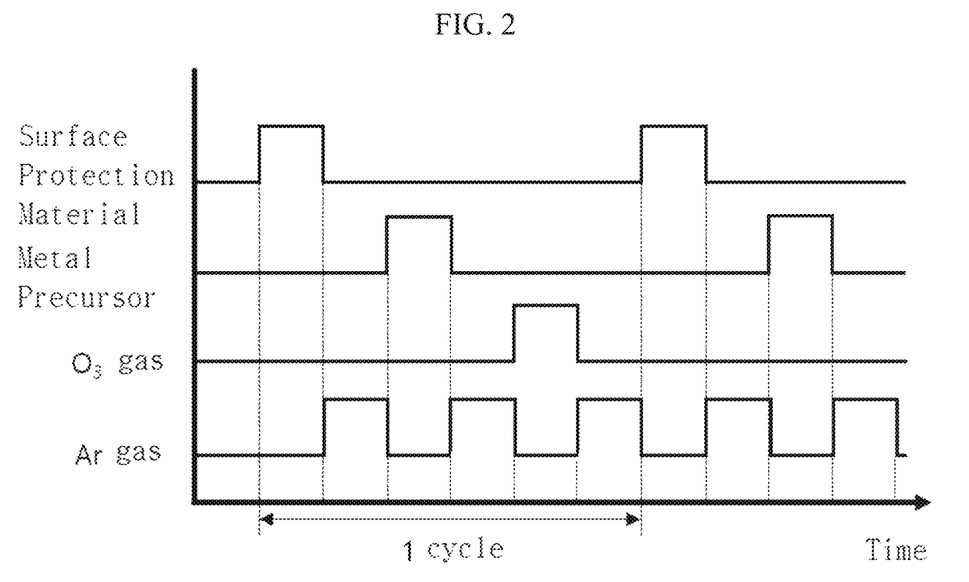
FIG. 2 is a graph schematically demonstrating a supply cycle according to an embodiment of the present invention.

FIG. 1 is a flowchart schematically demonstrating a method of forming a thin film according to an embodiment of the present invention, and FIG. 2 is a graph schematically demonstrating a supply cycle according to an embodiment of the present invention. A substrate is loaded into a process chamber, and following ALD process conditions are adjusted. ALD process conditions may include a temperature of the substrate or process chamber, a pressure in the process chamber, gas flow rate, and the temperature is 200 to 600° C.

The substrate is exposed to the surface protection material supplied to the interior of the chamber, and the surface protection material is adsorbed to the surface of the substrate. The surface protection material has a similar behavior to the metal precursor during the deposition process, in case of a trench structure having a high aspect ratio (for example, 40:1 or more), so that it is adsorbed at a high density in the entrance of the trench and at a low density in the bottom of the trench to impede the adsorption of the metal precursor in a subsequent process.

The surface protection material may be represented by the following Chemical Formula 1:

<Chemical Formula 1> wherein n is 1 or 2, and X is selected from the $CH_2$, O, S, NH, and R is selected from an alkyl group having 1 to 5 carbon atoms.

The surface protection material may be represented by the following Chemical Formula 2:

<Chemical Formula 2> wherein n is 1 or 2, and X is selected from the $CH_2$, O, S, NH, and R is selected from an alkyl group having 1 to 5 carbon atoms.

In addition, more specifically, the Chemical Formula 1 may be represented by the following Chemical Formula 3:

<Chemical Formula 3>

In addition, more specifically, the Chemical Formula 2 may be represented by the following Chemical Formula 4:

<Chemical Formula 4>

Thereafter, a purge gas (for example, an inert gas such as Ar) is supplied to the interior of the chamber to discharge the unadsorbed surface protection material or by-products.

Thereafter, the substrate is exposed to a metal precursor supplied to the interior of the chamber, and the metal precursor is adsorbed on the surface of the substrate. The metal precursor may include a group III element such as Al, a group IV element such as Zr, Hf, or a group V element such as Nb or Ta.

For example, the surface protection material described above is adsorbed in the entrance of the trench more densely than in the bottom of the trench, and the metal precursor cannot be adsorbed at the position where the surface protection material is adsorbed. That is, in the conventional deposition process, the metal precursor is adsorbed in the entrance of the trench more densely than in the bottom of the trench to have a high density in the entrance of the trench. But, in the present invention, the surface protection material is adsorbed in the entrance of the trench more densely than in the bottom of the trench to impede the adsorption of the metal precursor in the entrance of the trench, therefore, the metal precursor can be uniformly adsorbed in the trench without over-adsorption on the entrance of the trench, and the step coverage of the thin film described below can be improved.

Thereafter, a purge gas (for example, an inert gas such as Ar) is supplied to the interior of the chamber to discharge the unadsorbed metal precursors or by-products.

Thereafter, the substrate is exposed to a reaction material supplied to the interior of the chamber, and a thin film is formed on the surface of the substrate. The reaction material reacts with the metal precursor to form the thin film, and the reaction material may be water vapor ($H_2O$), oxygen ($O_2$) and ozone ($O_3$). A metal oxide film may be formed by the reaction. At this time, the reaction material oxidizes the adsorbed surface protection material, and the adsorbed surface protection material may be separated and removed from the surface of the substrate.

Thereafter, a purge gas (for example, an inert gas such as Ar) is supplied to the interior of the chamber to discharge the surface protective material/unreacted material or by-products.

On the other hand, it was previously described that the surface protection material is supplied before the metal precursor. Alternatively, the surface protection material may be supplied after the metal precursor or the metal precursor may be supplied both before and after the surface protection material.

COMPARATIVE EXAMPLE

A hafnium oxide film was formed on the silicon substrate without using the surface protection material described above. A hafnium oxide film was formed through the ALD process, the process temperature was 300 to 360° C., and the reaction material was ozone gas ($O_3$).

The process of forming the hafnium oxide film through the ALD process is as follows, and the following process is performed as one cycle.
1) Ar is used as a carrier gas, the hafnium precursor is supplied to the reaction chamber at room temperature, and the hafnium precursor is adsorbed onto the substrate.
2) Ar gas is supplied into the reaction chamber to discharge unadsorbed hafnium precursors or byproducts.
3) Monolayer is formed by supplying ozone gas ($O_3$) to the reaction chamber.
4) Ar gas is supplied into the reaction chamber to discharge unreacted substances or by-products.

Figure 3:
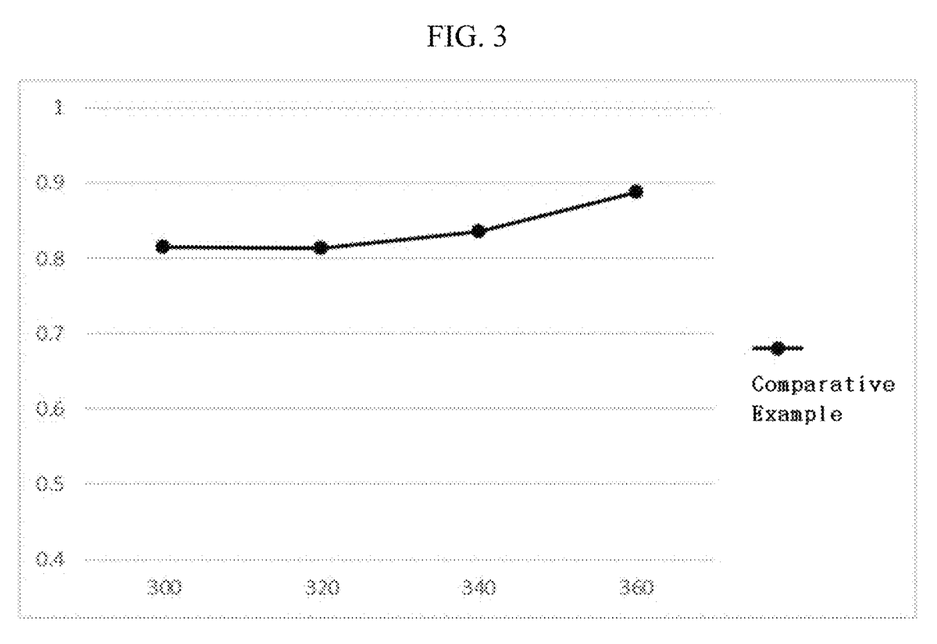
FIG. 3 is a graph demonstrating a GPC of the hafnium oxide film according to the process temperature, according to the Comparative Example of the present invention.

FIG. 3 is a graph demonstrating a GPC of the hafnium oxide film according to the process temperature, according to the Comparative Example of the present invention. As shown in FIG. 3, the ALD behavior is shown until the substrate temperature is 320° C., but the GPC is increased by 2.6% in the 320 to 340° C. section, and the GPC is increased as the substrate temperature increases above 320° C.

EXAMPLE 1

A hafnium oxide film was formed on a silicon substrate using MTHF (2-Methyl tetrahydrofuran) as a surface protection material. A hafnium oxide film was formed through the ALD process, the process temperature was 300 to 360° C., and the reaction material was ozone gas ($O_3$).

The process of forming a hafnium oxide film through the ALD process is as follows, and the following process is performed as one cycle (see FIGS. 1 and 2).
1) A surface protection material (MTHF) is supplied to the reaction chamber to be adsorbed onto the substrate.
2) Ar gas is supplied into the reaction chamber to discharge unadsorbed surface protection materials or by-products.
3) Ar is used as a carrier gas, the hafnium precursor is supplied to the reaction chamber at room temperature, and the hafnium precursor is adsorbed onto the substrate.
4) Ar gas is supplied into the reaction chamber to discharge unadsorbed hafnium precursors or byproducts.
5) Monolayer is formed by supplying ozone gas ($O_3$) to the reaction chamber
6) Ar gas is supplied into the reaction chamber to discharge unreacted substances or by-products.

Figure 4:
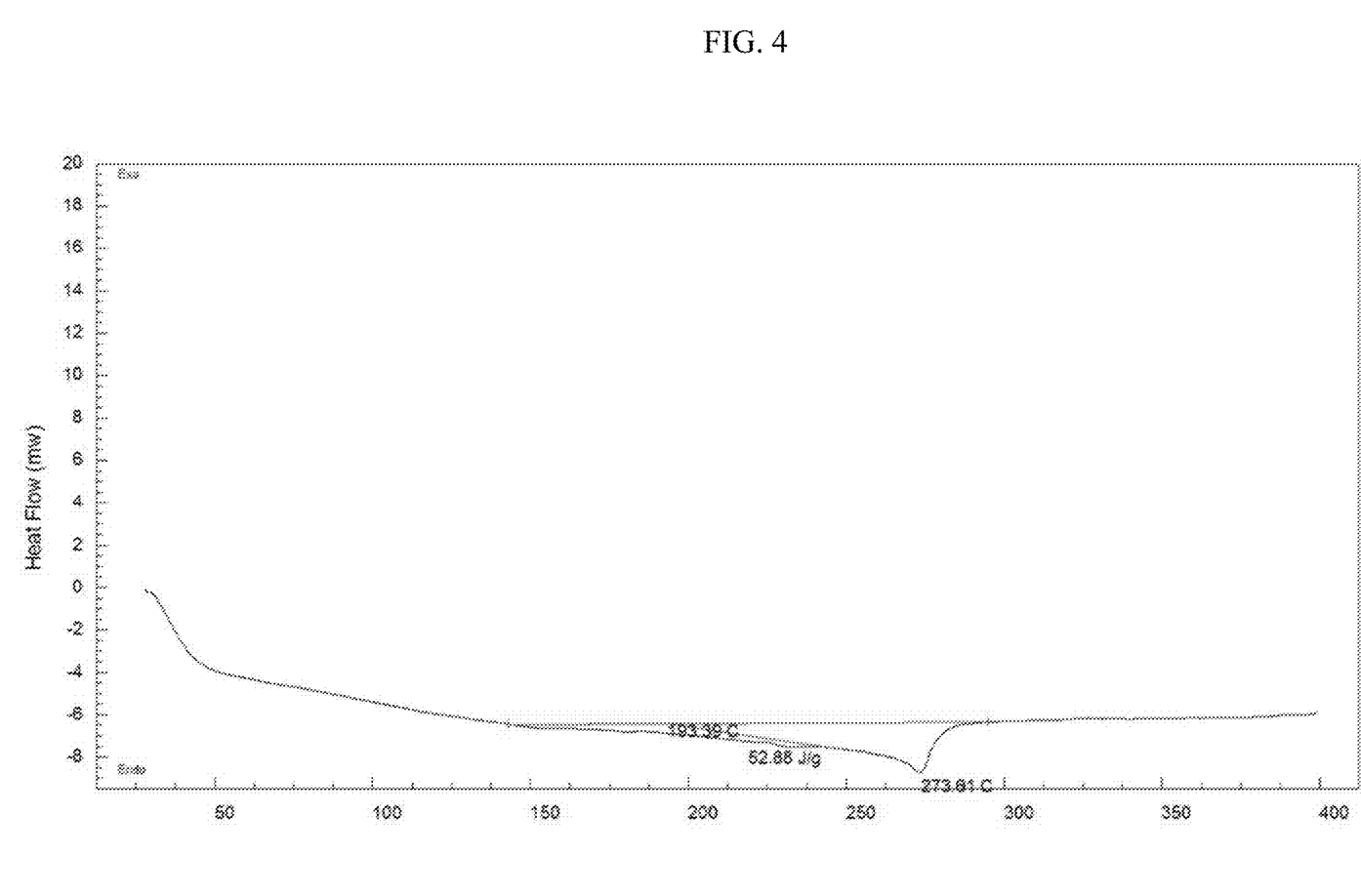
FIG. 4 is a graph demonstrating a DSC of the surface protection material, according to the Example 1 of the present invention.

FIG. 4 is a graph demonstrating a DSC of the surface protection material, according to the Example 1 of the present invention. Since the decomposition peak (upward direction) of the surface protection material is not detected up to 400° C., it can be seen that it has a surface protection effect without decomposition even when used at high temperatures.

Figure 5:
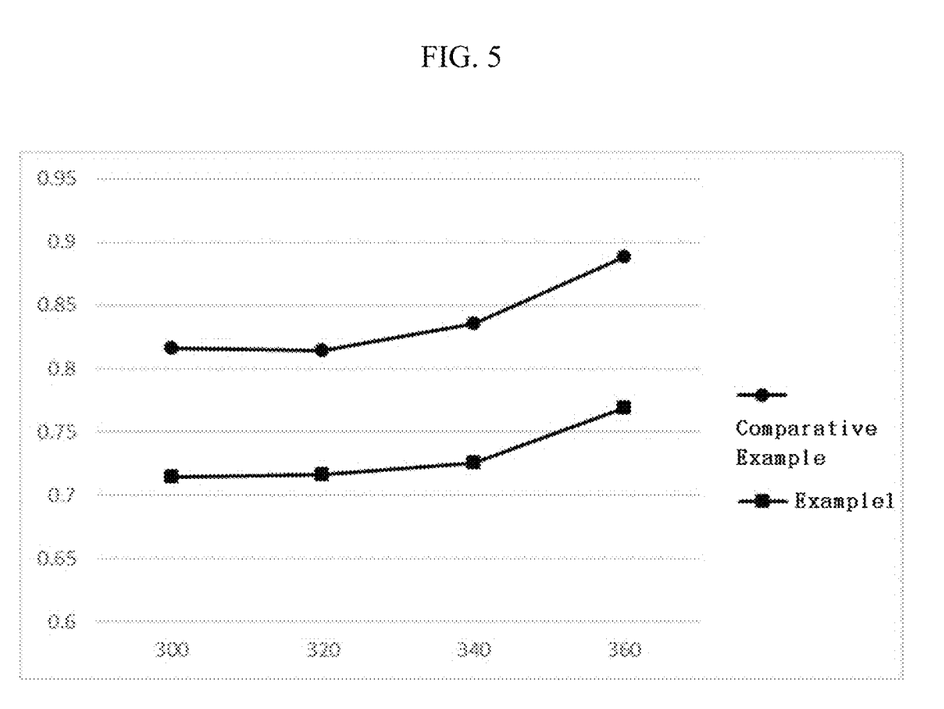
FIG. 5 is a graph demonstrating a GPC of the hafnium oxide film according to the process temperature, according to the Comparative Example and the Example 1 of the present invention.

FIG. 5 is a graph demonstrating a GPC of the hafnium oxide film according to the process temperature, according to the Comparative Example and the Example 1 of the present invention. Looking at the 320° C. to 340° C. section, the GPC increased by 2.6% in the case of the Comparative Example, whereas in the case of Example 1 using MTHF as the surface protection material, the GPC increased by 1.2% to decrease the GPC increase, and the ALD window widens up to 340° C.

EXAMPLE 2

A hafnium oxide film was formed on a silicon substrate in the same manner as in Example 1, except that the surface protection material was changed from MTHF to CPME (Cyclopentyl methyl ether).

Figure 6:
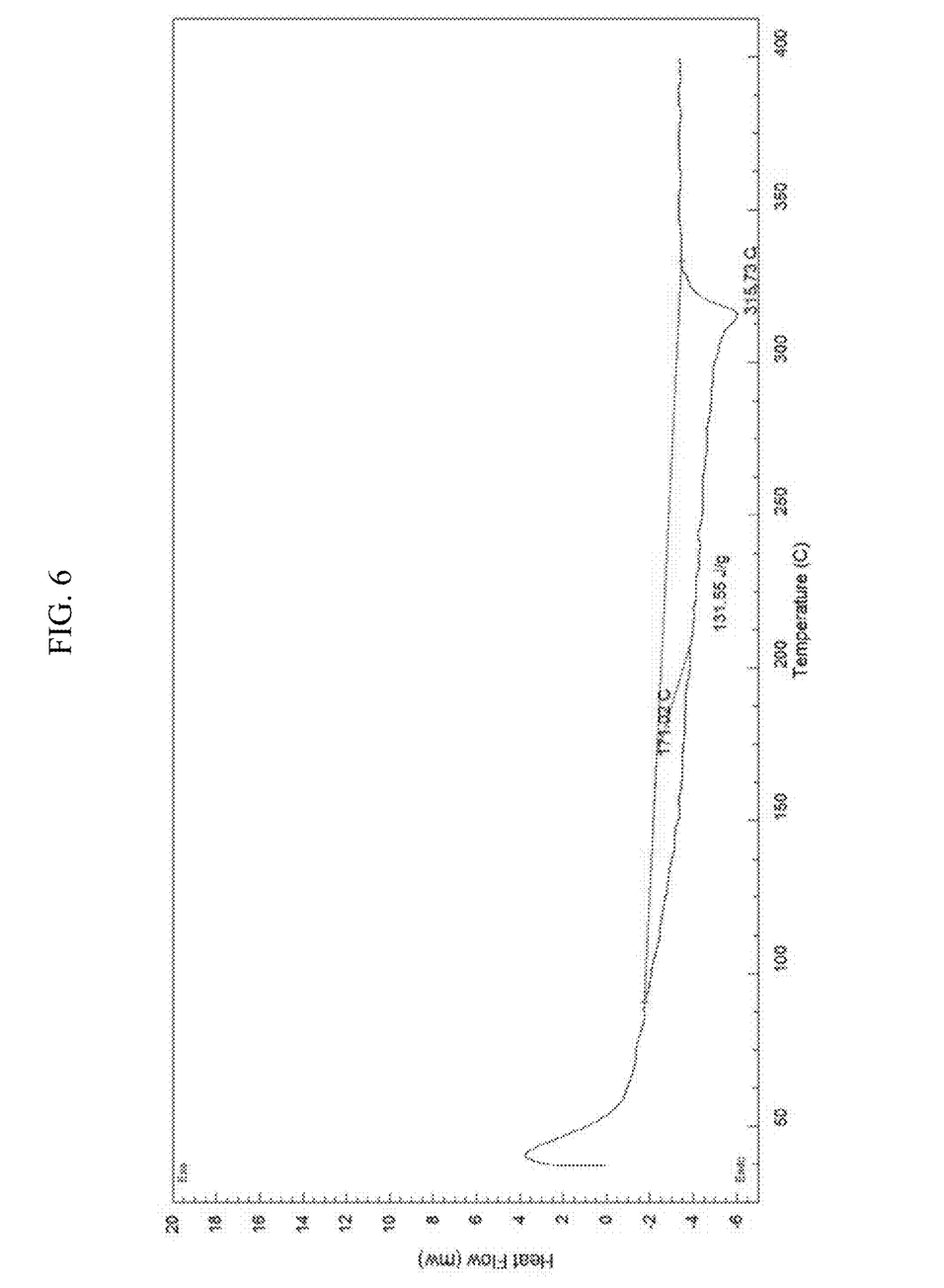
FIG. 6 is a graph demonstrating a DSC of the surface protection material, according to the Example 2 of the present invention.

FIG. 6 is a graph demonstrating a DSC of the surface protection material, according to the Example 2 of the present invention. Since the decomposition peak (upward direction) of the surface protection material is not detected up to 400° C., it can be seen that it has a surface protection effect without decomposition even when used at high temperatures.

Figure 7:
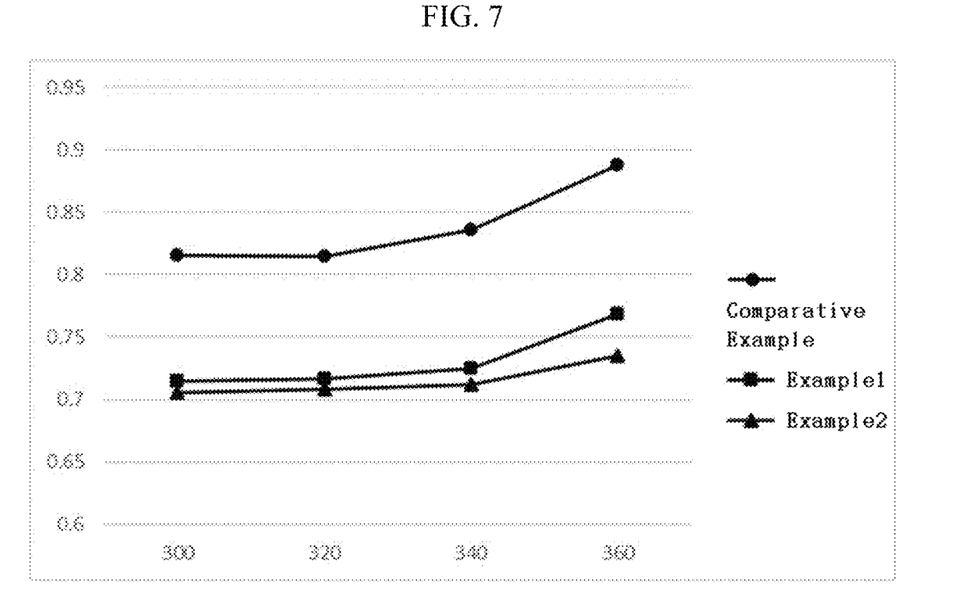
FIG. 7 is a graph demonstrating a GPC of the hafnium oxide film according to the process temperature, according to the Comparative Example and the Examples 1 and 2 of the present invention.
Figure 8:
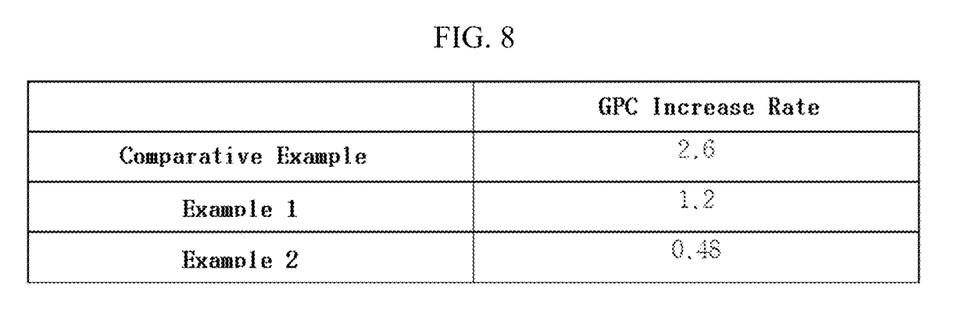
FIG. 8 is a table demonstrating a GPC increase rate according to the temperature increase in the Comparative Example and the Examples 1 and 2 of the present invention.

FIG. 7 is a graph demonstrating a GPC of the hafnium oxide film according to the process temperature, according to the Comparative Example and the Examples 1 and 2 of the present invention, and FIG. 8 is a table demonstrating a GPC increase rate according to the temperature increase in the Comparative Example and the Examples 1 and 2 of the present invention. Looking at the 320° C. to 340° C. section, the GPC increased by 2.6% in the case of the Comparative Example, whereas in the case of Example 1 using MTHF as the surface protection material, the GPC increased by 1.2% to decrease the GPC increase, and the ALD window widens up to 340° C., and in the case of Example 2 using CPME as a surface protection material, the GPC increased by 0.48% to decrease the GPC increase, and the ALD window widens up to 340° C.

In conclusion, the surface protection material alleviates the increase of the GPC according to the temperature rise, and it is possible to increase the temperature range in which the ALD process is possible. In addition, the surface protection material has a similar behavior to the metal precursor during the deposition process, in case of a trench structure having a high aspect ratio (for example, 40:1 or more), so that it is adsorbed at a high density in the entrance of the trench and at a low density in the bottom of the trench to impede the adsorption of the metal precursor in a subsequent process. Therefore, the metal precursor can be uniformly adsorbed in the trench.

Specifically, the step coverage of the hafnium oxide films according to the Comparative Examples and Examples 1 and 2 of the present invention is as follows, and in the case of the Examples 1 and 2, it can be seen that the step coverage is significantly improved compared to the Comparative Example.

TABLE 1

|  | Step Coverage (@300° C.) |
| --- | --- |
| Comparative Example | 84.7 |
| Examples 1 | 89.8 |
| Examples 2 | 88.2 |

According to the present invention, a thin film having good step coverage can be formed. The surface protection material has a similar behavior to the metal precursor during the deposition process. In case of a trench structure having a high aspect ratio (for example, 40:1 or more), the surface protection material is adsorbed at a high density in the entrance of the trench, and the surface protection material is adsorbed at a low density in the bottom of the trench, so that the adsorption of the metal precursor is impeded by the protection material. Therefore, the metal precursor can be adsorbed uniformly in the trench.

In addition, the surface protection material can alleviate the increase in the GPC according to the temperature rise, so that it is possible to increase the temperature range (ALD Window) in which the ALD process is possible.

The present invention has been explained in detail with reference to embodiments, but other embodiments may be included. Accordingly, the technical idea and scope described in the claims below are not limited to the embodiments.

The invention claimed is:

1. A method of forming a thin film using a surface protection material, the method comprising:
    supplying the surface protection material to the inside of a chamber on which a substrate is placed so that the surface protection material is adsorbed to the substrate;
    discharging unadsorbed surface protection material from the inside of the chamber by purging the interior of the chamber;
    supplying a metal precursor to the inside of the chamber so that the metal precursor is adsorbed to the substrate;
    discharging unadsorbed metal precursor from the inside of the chamber by purging the interior of the chamber; and
    supplying a reaction material to the inside of the chamber so that the reaction material reacts with the adsorbed metal precursor to form the thin film,
    wherein the surface protection material is represented by the following Chemical Formula 1:

<Chemical Formula 1> wherein n is 1 or 2, and X is selected from the $CH_2$, O, S, NH, and R is selected from an alkyl group having 1 to 5 carbon atoms.

2. The method of claim 1, wherein the surface protection material is represented by the following Chemical Formula 3:

<Chemical Formula 3>

3. The method of claim 1, wherein the reaction material is selected from water vapor ($H_2O$), oxygen ($O_2$) and ozone ($O_3$).

4. The method of claim 1, wherein the metal precursor is a compound including at least one of a trivalent metal containing Al, a tetravalent metal containing Zr or Hf, and a pentavalent metal containing Nb or Ta.

5. A method of forming a thin film using a surface protection material, the method comprising:
    supplying the surface protection material to the inside of a chamber on which a substrate is placed so that the surface protection material is adsorbed to the substrate;
    discharging unadsorbed surface protection material from the inside of the chamber by purging the interior of the chamber;
    supplying a metal precursor to the inside of the chamber so that the metal precursor is adsorbed to the substrate;
    discharging unadsorbed metal precursor from the inside of the chamber by purging the interior of the chamber; and
    supplying a reaction material to the inside of the chamber so that the reaction material reacts with the adsorbed metal precursor to form the thin film,
    wherein the surface protection material is represented by the following Chemical Formula 2:

<Chemical Formula 2> wherein n is 1 or 2, and X is selected from the $CH_2$, O, S, NH, and R is selected from an alkyl group having 1 to 5 carbon atoms.

6. The method of claim 5, wherein the surface protection material is represented by the following Chemical Formula 4:

<Chemical Formula 4>

7. The method of claim 5, wherein the reaction material is selected from water vapor ($H_2O$), oxygen ($O_2$) and ozone ($O_3$).

8. The method of claim 5, wherein the metal precursor is a compound including at least one of a trivalent metal containing Al, a tetravalent metal containing Zr or Hf, and a pentavalent metal containing Nb or Ta.

* * * * *